(12) United States Patent
Okajima et al.

(10) Patent No.: US 7,544,916 B2
(45) Date of Patent: Jun. 9, 2009

(54) HEATING DEVICE

(75) Inventors: Hisakazu Okajima, Nishikasugai-Gun (JP); Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 359 days.

(21) Appl. No.: 11/498,413

(22) Filed: Aug. 3, 2006

(65) Prior Publication Data

US 2007/0033824 A1  Feb. 15, 2007

(30) Foreign Application Priority Data

Aug. 12, 2005  (JP) ............................. 2005-234632

(51) Int. Cl.
*H05B 3/68* (2006.01)
*C23C 16/00* (2006.01)
(52) U.S. Cl. .................. 219/443.1; 219/444.1; 118/724
(58) Field of Classification Search .............. 219/444.1, 219/443.1; 118/724–725; 361/230–235
See application file for complete search history.

(56) References Cited

U.S. PATENT DOCUMENTS

| 5,059,770 | A | * | 10/1991 | Mahawili | ..................... 219/391 |
| 6,134,096 | A | * | 10/2000 | Yamada et al. | ............... 361/234 |
| 6,223,447 | B1 | | 5/2001 | Yudovsky et al. | |
| 6,494,955 | B1 | | 12/2002 | Lei et al. | |
| 6,549,393 | B2 | * | 4/2003 | Kanno et al. | ................. 361/234 |
| 6,846,364 | B2 | | 1/2005 | Pyo | |

FOREIGN PATENT DOCUMENTS

JP  2002-093894 A1  3/2002
KR  2001-0111749  12/2001

* cited by examiner

*Primary Examiner*—Sang Y Paik
(74) *Attorney, Agent, or Firm*—Burr & Brown (57) ABSTRACT

A heating device is provided, including a ceramic base in which a resistance heating body is embedded, gas flow passages formed in an inside portion of the base, and adjustment members which vary flow rates of a gas provided in the gas flow passages.

6 Claims, 2 Drawing Sheets

HEATING DEVICE

CROSS REFERENCE TO RELATED APPLICATIONS

This application is based upon and claims the benefit of priority from Japanese Patent Application No. 2005-234632, filed on Aug. 12, 2005; the entire contents of which are incorporated herein by reference.

BACKGROUND OF THE INVENTION

1. Field of the Invention

The present invention relates to a heating device.

2. Description of the Related Art

Heretofore, in a semiconductor manufacturing process and a liquid crystal device manufacturing process, a heating device has been used in order to heat up a substrate such as a silicon wafer. The heating device includes a physical vapor deposition (PVD) device, a chemical vapor deposition (CVD) device, a dry etching device, and the like, which frequently use corrosive gas. In general, a base which constitutes the heating device is formed of ceramics from a viewpoint of corrosion resistance.

In the semiconductor manufacturing process and the liquid crystal device manufacturing process, which are as described above, a reacted film has been deposited on an outer circumferential portion of the substrate mounted on a substrate heating surface of the heating device in some cases. Here, the reacted film has been sometimes adhered to the substrate heating surface though the substrate has not been adhered thereto.

Thus, it has become difficult for the reacted film to be peeled off from the substrate heating surface when the substrate is separated from the substrate heating surface, causing an apprehension that the substrate and the reacted film may be broken.

Accordingly, for the purpose of preventing such breakage, there is known a technology, in which plural gas injection ports are provided on the substrate heating surface, and gas is injected from the gas injection ports, thereby preventing the reacted film from being deposited on the outer circumferential portion of the substrate (for example, refer to Japanese Patent Laid-Open Publication No. 2002-93894).

Incidentally, when injection amounts of the gas from the gas injection ports are increased, such increase affects generation of a grown film on the substrate, and the like, though the deposition of the reacted film on the outer circumferential portion of the substrate can be reduced. Accordingly, the injection amounts of the gas cannot be increased thoughtlessly. Hence, it is necessary to set the injection amounts of the gas from the respective gas injection ports at an amount at which the deposition of the reacted film is reduced and the generation of the grown film, and the like, are not affected.

However, according to the conventional heating device described above, the plural gas flow passages are formed by a cutting process and the like in an inside of the heating device formed of fired ceramics. Accordingly, it is difficult to enhance process accuracy of the gas flow passages. Specifically, it is difficult to uniform the respective gas flow passages in cross-sectional area, and variations occur on the injection amounts of the gas from the respective gas injection ports.

Hence, even if the injection amount of the gas from one gas injection port is set at the optimum amount, the amounts of the gas from the other gas injection ports are not optimized in some cases. Moreover, there is a problem that the injection amounts of the gas cannot be adjusted once the gas flow passages are processed and fabricated.

SUMMARY OF THE INVENTION

In this connection, it is an object of the present invention to provide a heating device, which makes the injection amounts of the gas injected from the gas injection ports uniform, and which reduces the deposition amount of the reacted film deposited on the outer circumferential portion of the substrate without affecting the generation of the grown film on the substrate, and the like.

The heating device of the present invention includes: a base containing ceramics, in an inside of which gas flow passages are formed; a resistance heating body embedded in the base; and gas flow rate adjusting means for varying flow rates of gas flowing through insides of the gas flow passages, wherein a front surface of the base is formed into a substrate heating surface which heats up a substrate, and gas injection ports are opened on the substrate heating surface, one end of each of the gas flow passages is formed into the gas injection port, and the other end is formed into a gas introduction port which flows the gas therefrom into the gas flow passage, and the gas introduced from the gas introduction ports flows through the insides of the gas flow passages, and is discharged from the gas injection ports to the substrate heating surface.

According to the heating device as described above, the gas flow rate adjusting means is provided, thus making it possible to easily adjust the flow rates of the gas which flows through the insides of the gas flow passages. Hence, the injection amounts of the gas injected from the gas injection ports can be uniformed with one another, and the deposition of the reacted film can be reduced without affecting the generation of the grown film on the substrate, and the like.

Moreover, it is preferable that adjustment members which include insertion portions be provided as the gas flow rate adjusting means. It is preferable that the insertion portions be provided in the adjustment members, and that each of the insertion portions be composed to be capable of being inserted into an insertion hole provided in the base.

According to this, the insertion portions of the adjustment members are inserted into the insertion holes, and the insertion portions are made to protrude into the gas flow passages, thus making it possible to easily adjust the flow rates of the gas in the gas flow passages.

It is preferable that the base have a plate shape, that each of the gas flow passages include a first gas passage extended along the substrate heating surface, and that each of the insertion holes be made to communicate with the first gas passage from a back surface of the base.

According to this, the flow rates of the gas which flows through the first gas passages extended along the substrate heating surface can be adjusted by the gas flow rate adjusting means. Thus, a temperature distribution of the base can be adjusted at the same time of adjusting the injection amounts of the gas onto the substrate heating surface.

Moreover, it is preferable that insertion holes which communicate with the first gas passages be provided on the back surface of the base. According to this, the flow rates of the gas can be adjusted from the back surface of the base. Hence, in the case of disposing the substrate on the substrate heating surface, the adjustment members do not hinder such disposition.

It is preferable that the base has a plate shape, that the gas injection ports are disposed on outer circumferential end portions of the substrate heating surface, that each of the gas flow passages includes a second gas passage extended in a substantially perpendicular direction to the substrate heating surface, and that the insertion holes communicate with the second gas passages from a side surface of the base.

According to this, the gas injection ports are disposed on the outer circumferential end portion of the substrate heating surface, and the insertion holes communicate with the second gas passages from the side surface of the base, thus making it possible to adjust the injection amounts of the gas at positions close to the gas injection ports. Thus, the deposition of the reacted film on the periphery of the substrate can be further reduced. Moreover, the insertion holes are provided on the side surface of the base, thus making it possible to facilitate the process of the first gas passages.

It is preferable that the insertion portions of the adjustment members have a pillar shape having a cross-sectional shape substantially equal to that of the insertion holes.

According to this, a gap between each insertion hole in the base and each insertion portion of the adjustment members becomes extremely small, and the leakage of the gas from the insertion holes can be reduced. Moreover, since the insertion portions have the pillar shape, it is difficult for the insertion portions to be detached from the insertion holes even if the insertion portions are inserted into the insertion holes, thus making it possible to easily change the flow rates of the gas which flows through the insides of the gas flow passages. Thus, the injection amounts of the gas from the gas injection ports formed on the substrate heating surface can be adjusted more easily.

It is preferable that each insertion portion of the adjustment members and each insertion hole in the base include spiral grooves.

According to this, the cross-sectional areas of the gas flow passages can be finely adjusted. Moreover, since the spiral groove is formed on each of the insertion portions of the adjustment members, the adjustment members can be surely prevented from falling off of the base.

It is preferable that the insertion portions be made of ceramics.

According to this, a difference in thermal expansion coefficient between the base and the insertion portions of the adjustment members can be reduced, and accordingly, deformation and the like of the adjustment members owing to a temperature change can be prevented.

According to the present invention, the injection amounts of the gas injected from the gas injection ports can be uniformed with one another, and the deposition of the reacted film can be reduced without affecting the generation of the grown film on the substrate, and the like.

DETAILED DESCRIPTION OF THE INVENTION

Next, a description will be made of an embodiment of the present invention with reference to the drawings. Note that the same or similar reference numerals are assigned to the same or similar portions in a description of the drawings.

However, the drawings are schematic ones, and it should be noted that a ratio of the respective dimensions, and the like are different from the actual ones.

Figure 1:
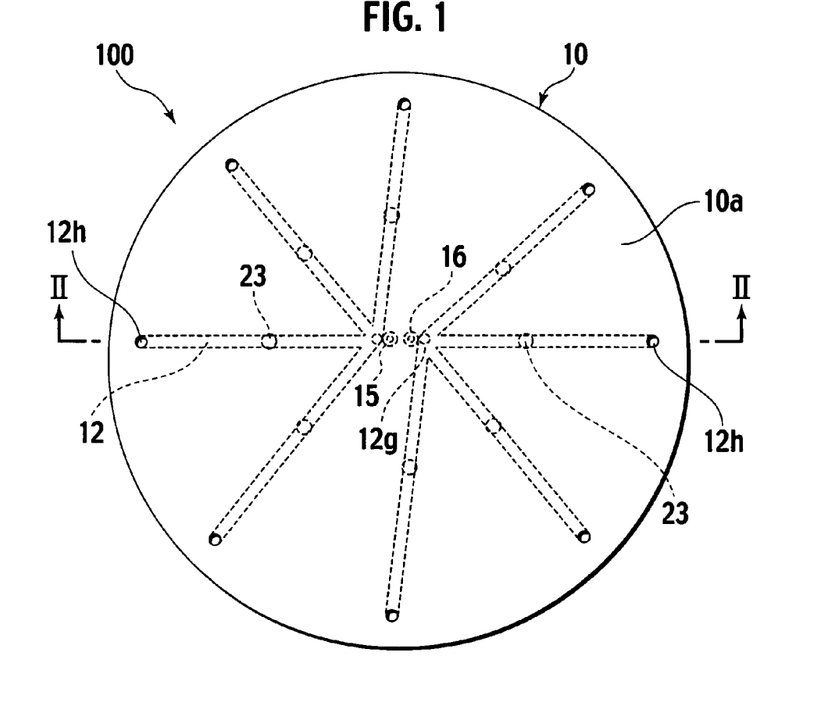
FIG. 1 is a plan view of a heating device according to an embodiment of the present invention.

FIG. 1 is a plan view of a heating device according to this embodiment when viewed from the above. Note that, in FIG. 1, a resistance heating body 11, a tubular member 17, and the like are omitted for the purpose of clearly showing gas flow passages 12.

The gas flow passages 12 extend radially from an approximate center portion of a substrate heating surface 10a toward an outer circumferential portion thereof. In this case, the plural gas flow passages 12 are arranged so that circumferential angles made by adjacent ones thereof are uniform with one another. For example, as shown in FIG. 1, the gas flow passages 12 are arranged so that an angle made by a predetermined gas flow passage 12 and a gas flow passage 12 adjacent thereto are approximately 45 degrees.

It is preferable that insertion holes 23 is provided at positions of 30% with respect to a distance from a center of the substrate heating surface 10a to the outer circumferential ends thereof. Specifically, a ratio of the distance from the center of the substrate heating surface 10a to the outer circumferential ends thereof with respect to a distance from the center of the substrate heating surface 10a to the insertion holes 23 is set at 10:3.

Figure 2:
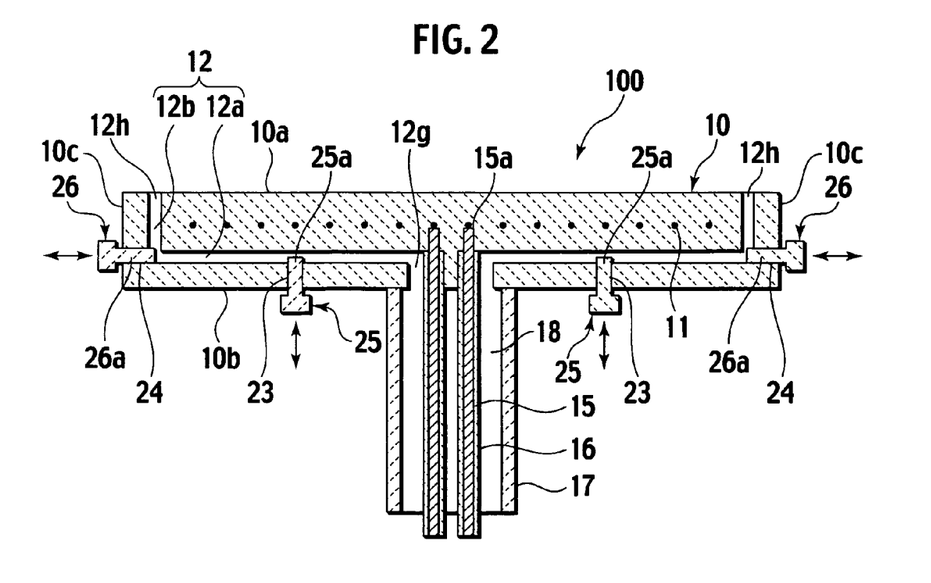
FIG. 2 is a cross-sectional view taken along a line II-II of FIG. 1.

FIG. 2 is a cross-sectional view taken along a line II-II of FIG. 1.

As shown in FIG. 2, a heating device 100 includes a base 10 containing ceramics, the resistance heating body 11 embedded inside the base 10, adjustment members 25 and 26 as gas flow rate adjusting means, power supply members 15 connected to the resistance heating body 11, electrical insulating members 16 which cover outer circumferential surfaces of the power supply members 15, and a tubular member 17 attached to a back surface (lower surface) 10b of the base 10.

Moreover, a front surface (upper surface) of the base 10 is formed into the substrate heating surface 10a. Gas injection ports 12h are opened on the outer circumferential ends of the substrate heating surface 10a.

The heating device 100 applies power to the resistance heating body 11 from the power supply members 15. Thus, the heating device 100 heats up the substrate heating surface 10a, and heats up a substrate mounted on the substrate heating surface 10a.

The base 10 includes the substrate heating surface 10a, the resistance heating body 11, the gas flow passages 12, and the insertion holes 23 and 24.

It is preferable that the base 10 be formed into a plate shape, for example, into a disc shape and the like. The base 10 is made of ceramics, a composite material of ceramics and metal, or the like. For example, the base 10 can be formed of a sintered body of aluminum nitride (AlN), alumina ($Al_2O_3$), silicon nitride (SiN) silicon carbide (SiC), sialon (SiAlON), or the like, aluminum (Al), an aluminum alloy, an aluminum alloy-aluminum nitride composite, an aluminum alloy-SiC composite, or the like. The base 10 can contain yttrium oxide or the like as sintering aids. However, it is preferable that a total amount of the components other than the above-described main component material which forms the base 10 be 5 wt % or less.

Note that the base 10 has insertion holes for attaching the power supply members 15 thereto. Upper end portions 15a of the power supply members 15 are inserted into the insertion holes, and are connected to the resistance heating body 11.

The substrate such as a silicon substrate and a glass substrate is mounted on the substrate heating surface 10a. As described above, the gas injection ports 12h are formed on the outer circumferential ends of the substrate heating surface 10a.

The resistance heating body 11 is embedded inside the base 10. For the resistance heating body 11, niobium, molybdenum, tungsten, or the like can be used. For the resistance heating body 11, an article of which shape is linear, coil-like, belt-like, mesh-like, film-like, and so on can be used.

The gas flow passages 12 are formed inside the base 10, and communicate with the gas injection ports 12h of the substrate heating surface 10a through the gas introduction ports 12g which introduce the gas.

The gas flow passages 12 are composed of first gas passages 12a and second gas passages 12b. The first gas passages 12a are arranged in a lower portion of the base 10, and are extended along the substrate heating surface 10a. Moreover, the second gas passages 12b are bent from outer circumferential ends of the first gas passages 12a, and are directed upward. Specifically, the second gas passages 12b are arranged in outer circumferential ends of the base 10, and are extended vertically so as to be perpendicular to the substrate heating surface 10a. Moreover, upper end portions of the second gas passages 12b are formed into the gas injection ports 12h, and inner circumferential ends of the first gas passage 12a are formed into the gas introduction ports 12g. Note that, preferably, an inner diameter of the gas flow passages 12 is 2 to 4 mm.

It is preferable that the gas flow passages 12 are formed below the resistance heating body 11 inside the base 10.

The insertion holes 23 and 24 are provided on the back surface and side surface of the base 10. Specifically, the insertion holes 23 are provided on the back surface of the base 10, and the insertion holes 24 are provided on the side surface of the base 10. It is preferable that the insertion holes 24 be arranged on extended lines of the first gas passages 12a. Note that, preferably, an inner diameter of the insertion holes 23 is 1 to 5 mm. The insertion holes 23 and 24 are formed so that inner diameter dimensions thereof can be substantially the same as outer diameter dimensions of the insertion portions 25a and 26a of the adjustment members 25 and 26.

The adjustment members 25 include insertion portions 25a that are inserted into the insertion holes 23, and the adjustment members 26 include insertion portions 26a that are inserted into the insertion holes 24. It is preferable that the insertion portions 25a and 26a are inserted into the insertion holes 23 and 24 in a state of being brought into intimate contact therewith. Moreover, the insertion portions 25a and 26a are formed into a pillar shape (stick shape) such as a columnar shape and a polygonal shape.

Moreover, the insertion portions 25a and 26a are capable of protruding/retreating into/out of the inner portions of the gas flow passages 12. The insertion portions 25a and 26a are made to protrude into the inner portion of the gas flow passages 12 as described above, thus making it possible to adjust flow rates of the gas which flows through the inner portions of the gas flow passages 12. Specifically, when the insertion portions 25a and 26a of the adjustment members 25 and 26 are made to protrude into the gas flow passages 12, the cross-sectional areas of the gas flow passages 12 are changed. Accordingly, the flow rates of the gas, which correspond to the respective cross-sectional areas, can be controlled. For example, in order to reduce the flow rates of the gas, the amount that the insertion portions 25a and 26a protrude into the gas flow passages 12 is increased, and in order to increase the flow rates of the gas, the amount that the insertion portions 25a and 26a protrude into the gas flow passages 12 is reduced.

The adjustment members 25 and 26 are formed of ceramics, composite material of the ceramics and metal, or the like. In particular, it is preferable to form the adjustment members 25 and 26 of the same material as that of the base 10.

The power supply members 15 are connected to the resistance heating body 11, and supply the power to the resistance heating body 11. The power supply members 15 are formed of Ni, Al, Cu, an alloy thereof, or the like. The power supply members 15 are formed into a rod shape, and are connected to the resistance heating body 11 by brazing or the like. The power supply members 15 are covered with the electrical insulating members 16 made of ceramics or the like.

The tubular member 17 is joined to the back surface 10b of the base 10, and thus supports the base 10. The tubular member 17 is a hollow cylinder or the like, and houses the power supply members 15 in an inner circumference side thereof. Moreover, a gas providing passage 18 is formed in the inner circumference side of the tubular member 17, and an upper end portion of the gas providing passage 18 communicates with the gas introduction ports 12g of the base 10.

Hence, the gas is introduced into the inner portions of the gas flow passages 12 of the base 10 from the gas providing passage 18 of the tubular member 17 through the gas introduction ports 12g of the base 10. Then, the gas is fed from the gas injection ports 12h of the substrate heating surface 10a to the substrate heating surface 10a. Note that the tubular member 17 is formed of aluminum nitride, silicon nitride, aluminum oxide, or the like.

Figure 3:
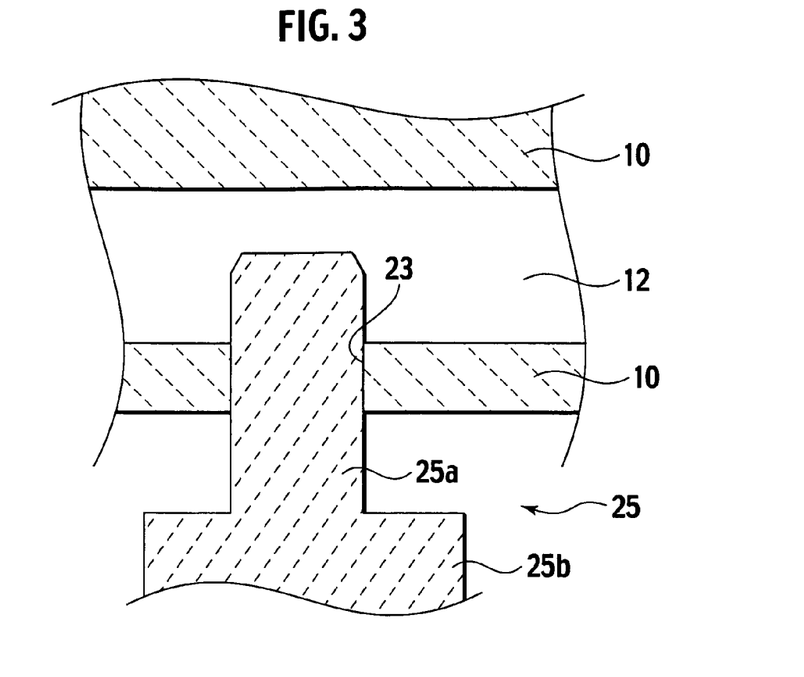
FIG. 3 is a cross-sectional view showing a vicinity of an adjustment member of the heating device according to the embodiment of the present invention.
Figure 4:
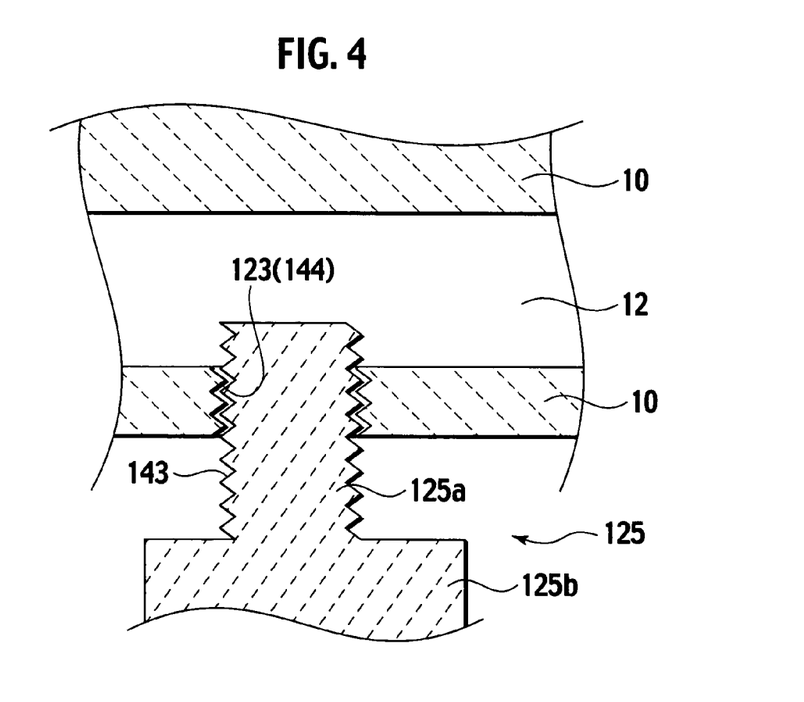
FIG. 4 is a cross-sectional view showing a vicinity of another adjustment member according to the embodiment of the present invention.

FIGS. 3 and 4 are cross-sectional views showing the adjustment members of the heating device according to the embodiment of the present invention.

The adjustment member 25 shown in FIG. 3 is one in which the insertion portion 25a is inserted into the insertion hole 23 formed in the base 10 in intimate contact therewith and a support portion 25b, which supports the insertion portion 25a, are formed integrally. The insertion portion 25a is formed so that the outer diameter dimension thereof can be substantially equal to the inner diameter dimension of the insertion hole 23. The insertion portion 25a has a slender columnar shape (rod shape), and an outer circumferential surface thereof is formed smoothly.

An adjustment member 125 shown in FIG. 4 is the one in which an insertion portion 125a inserted into an insertion hole 123 formed in the base 10 in an intimate contact state therewith and a support portion 125b which supports the insertion portion 125a are formed integrally. The insertion portion 125a is formed so that an outer diameter dimension thereof can be substantially equal to an inner diameter dimension of the insertion hole 123. The insertion portion 125a has a slender columnar shape (rod shape), and on an outer circumferential surface thereof, a spiral groove 143 is formed.

Moreover, also on an inner circumferential surface of the insertion hole 123, a groove 144 to be screwed to the groove 143 of the insertion portion 125a is formed.

Note that, in FIG. 4, for the purpose of clearly showing the insertion portion 125a and the insertion hole 123, an illustration is shown as if a gap were provided between the insertion portion 125a and the insertion hole 123. However, the insertion portion 125a and the insertion hole 123 are actually brought into intimate contact with each other, and it is preferable that gap hardly occurs.

In the heating device 100 according to the present invention, which has been described above, when the gas is provided thereto from a lower portion of the gas providing passage 18 of the tubular member 17 as shown in FIG. 2, the gas is introduced into the gas flow passages 12 through the gas introduction ports 12g, and is then discharged from the gas injection ports 12h. Thus, generation of a reacted film deposited on an outer circumferential portion of the substrate can be reduced.

Moreover, heat conduction in the substrate heating surface 10a can be further uniformed by heat conduction brought by the gas. It is preferable that the gas be publicly known gas, for example, nitrogen gas, helium gas, argon gas, a mixed gas of the helium gas and the argon gas, or the like, and that the gas flows under a pressure of 1 atm. at a flow rate of 0.5 to 20 L/min in conversion at 0° C.

A description will be made below of the function and effect which are brought by the heating device 100 according to this embodiment.

The adjustment members 25, 26 and 125 as the gas flow rate adjusting means for varying the gas flow rates in the insides of the gas flow passages 12 are provided, thus making it possible to uniform injection amounts of the gas injected from the gas injection ports 12h of the respective gas flow passages 12. Thus, the deposition of the reacted film can be reduced.

The adjustment members 25, 26 and 125 include the insertion portions 25a, 26a and 125a which protrude into the gas flow passages 12, respectively, thus making it possible to adjust the injection amount of the gas from the outside of the heating device 100, and to adjust the injection of the gas onto the substrate heating surface 10a while making a direct confirmation thereof.

In particular, the gas flow passages 12 include a plurality of first gas passages 12a extending along the substrate heating surface 10a, and accordingly, the injection amounts of the gas that flows through the respective first gas passages 12a can be made uniform. Thus, the temperature distribution of the base 10 can be adjusted at the same time the injection amount of the gas onto the substrate heating surface 10a is adjusted.

Moreover, the injection amount of the gas can be adjusted by using the adjustment members 25 and 125 provided on the back surface 10b of the base 10, and accordingly, the work of adjusting the injection amount of the gas does not hinder the work of mounting the substrate on the substrate heating surface 10a.

The gas flow passages 12 include second gas passages 12b that extend in a substantially perpendicular direction with respect to the substrate heating surface 10a, and accordingly, adjust the amount of the gas injected at positions close to the gas injection ports 12h. Thus, the deposition of the reacted film on the outer circumferential portion of the substrate can be further reduced.

The insertion portions 25a, 26a and 125a of the adjustment members 25, 26 and 125 are formed into a pillar shape so that the outer diameter dimensions thereof can be substantially equal to the inner diameter dimensions of the insertion holes 23, 24 and 123. Accordingly, leakage of the gas from the insertion holes 23, 24 and 123 can be reduced. Moreover, the amounts of the injected gas can be adjusted with ease.

The spiral grooves 143 and 144 are formed on the outer circumference of the insertion portion 125a of the adjustment member 125 and on the inner circumference of the insertion hole 123, respectively. Accordingly, the adjustment member 125 is gradually rotated, thus making it possible to finely adjust the amount that the insertion portion 125a protrudes into each gas flow passage 12. Moreover, the adjustment member 125 can be surely prevented from falling off of the insertion hole 123 of the base 10.

Moreover, the adjustment members 25, 26 and 125 are formed of the same material as that of the base 10, thus making it possible to reduce the difference between the thermal expansion coefficient of the base 10 and the adjustment members 25, 26 and 125. Hence, when the temperature of the base 10 changes, thermal deformations of the base 10 and the adjustment members 25, 26 and 125 can be reduced. Thus, gaps can be prevented from occurring between the insertion portions 25a, 26a and 125a of the adjustment members 25, 26 and 125 and the insertion holes 23, 24 and 123, and the sliding capabilities of the insertion portions 25a, 26a and 125a can be prevented from being decreased.

It is preferable that surface roughness (Ra) of the substrate heating surface 10a be 0.01 μm to 6.3 μm. Thus, the substrate is made to surely abut on the substrate heating surface 10a, thus making it possible to keep the temperature of the substrate uniform.

The resistance heating body 11 is embedded inside the base 10, thus making it possible to prevent the resistance heating body 11 from being deteriorated, and to enhance durability thereof.

The first gas passages 12a are arranged below the resistance heating body 11. Accordingly, the gas which flows through the first gas passages 12a does not affect the heat transmitted from the resistance heating body 11 to the substrate heating surface 10a.

The second gas passages 12b are formed on the outer circumferential ends of the substrate heating surface 10a, thus making it possible to provide the gas to the outer circumferential portion of the substrate, where the reacted film is most prone to be formed, and to further reduce the deposition of the reacted film.

Moreover, the diameter of the gas flow passages 12 is 2 to 4 mm, thus making it possible to stabilize the injection amount of the gas which reduces the deposition of the reacted film.

The insertion holes 23 are formed at the positions where the distance thereto from the center of the back surface 10b of the base 10 is 30% with respect to the distance from the center of the substrate heating surface 10a to the outer circumferential ends thereof. Accordingly, the flow rates of the gas in the gas flow passages 12 are adjusted by the adjustment members 25, thus making it possible to effectively adjust the temperature distribution of the base 10.

The outer diameters of the insertion holes 23, 24 and 123 are 40 to 400% with respect to the inner diameter of the gas flow passages 12, thus making it possible to optimize the cross-sectional areas of the gas flow passages 12, which are adjusted by the adjustment members 25, 26 and 125.

The electrical insulating members 16 are formed of ceramics, thus making it possible to have both electrical insulating and heat insulating properties. Thus, the influence given to members located in the periphery of the power supply members 15 can be reduced.

Moreover, it is preferable that the tubular member 17 be formed of the same type of material as that of the base 10. According to this, thermal stress which may be caused by the difference between the thermal expansion coefficient of the base 10 and the tubular member 17 can be prevented from occurring in the joined portion thereof, and the tubular member 17 can be strongly joined to the base 10. Moreover, the base 10 and the tubular member 17 may be formed integrally.

[Manufacturing Method of Heating Device]

A process of manufacturing the heating device 100 described above includes the step of forming the base 10, the step of forming the gas flow passages 12 and the insertion holes 23, 24 and 123 in the base 10, and the step of attaching the adjustment members 25, 26 and 125 to the base 10.

First, the base 10 is fabricated as below.

To ceramic material powder, there are added and mixed a binder, and according to needs, an organic solvent, a dispersant, and the like. In such a way, slurry was prepared.

It is preferable that the ceramic material powder contain ceramic powder as a main component, the sintering aids, and the binder. For example, aluminum nitride powder is used as the main component, and yttrium oxide powder and the like are added as the sintering aids. However, it is preferable that the total amount of the components other than the ceramic powder as the main component be 5 wt % or less. It is preferable to mix the ceramic material powder by a ball mill and the like.

The obtained slurry is granulated by a spray granulation method and the like, and granulated granules are thus obtained. The granulated granules thus obtained are molded by a molding method such as a metal die molding method, a cold isostatic pressing (CIP) method, and a slip cast method, and a first molded body is fabricated.

Next, the resistance heating body 11 is formed on the first molded body. For example, a printing paste containing powder of a high melting point material such as molybdenum (Mo), tungsten (W), niobium (Nb), and tungsten carbide (WC) is prepared, and is printed on the first molded body by a screen printing method and the like so as to form a predetermined pattern. In such a way, the resistance heating body 11 can be formed.

Thereafter, a second molded body is stacked on the first molded body on which the resistance heating body 11 is formed, and the first molded body and the second molded body are subjected to pressure molding. It is preferable that the second molded body be fabricated by a similar method to that used for the first molded body.

Alternatively, a method may also be adopted, which houses, in a metal mold or the like, the first molded body on which the resistance heating body 11 is formed, fills the granulated granules onto the first molded body, and performs the pressure molding for the granulated granules and the first molded body.

Then, the molded body in which the resistance heating body 11 is embedded is integrally fired by a firing method such as a hot press method and a pressureless sintering method, thus making it possible to fabricate the base 10 composed of the sintered body. For example, the obtained molded body can be fired under conditions corresponding to the type of ceramics, which include an atmosphere, a firing temperature, a firing time, and a firing method.

For example, in the case of using aluminum nitride powder as the ceramic material powder, the molded body can be fired by using the hot press method by being held for approximately 1 to 10 hours at a temperature of 1700 to 2200° C. in an atmosphere of inert gas such as the nitrogen gas and the argon gas. It is preferable to set the pressure applied to the molded body during the firing at 20 to 1000 kgf/cm$^2$. According to this, the base 10 and the resistance heating body 11 can be brought into intimate contact with each other in a favorable manner. It is more preferable that the firing temperature be 1750 to 2050° C., and it is more preferable that the pressure be 50 to 200 kgf/cm$^2$. Finally, in the obtained base 10, the substrate heating surface 10a is subjected to a planarization process, and the base 10 is subjected to a drilling process of holes for the power supply members, which is for the purpose of connecting the power supply members 15 to the resistance heating body 11, and a part of the resistance heating body 11 is thus exposed in advance. Then, the gas introduction ports 12g are formed from the back surface 10b of the base 10 by a machining process.

Next, the gas flow passages 12 are formed in the base 10 by the drilling process and the like. With regard to a procedure, the first gas passages 12a are formed from the gas introduction ports 12g toward the outer circumferential direction, and the second gas passages 12b are formed upward from the ends of the first gas passages 12a.

Specifically, the plural first gas passages 12a are formed so that an angle made by a predetermined first gas passage 12a and a first gas passage 12a adjacent thereto can be uniform with the others (refer to FIG. 1). In this case, the first gas passages 12a are arranged below the resistance heating body 11. Then, the second gas passages 12b are formed from the substrate heating surface 10a toward the first gas passages 12a by the machining process. The second gas passages 12b are formed with a diameter of, for example, 3 mm along the outer circumference of the substrate.

Moreover, in a similar way to the above, through holes and the like for lifting up the substrate are also processed. It is preferable that the second gas passages 12b be processed perpendicularly to the substrate heating surface 10a.

Next, the insertion holes 23 and 24 are formed on the base 10 by the drilling process and the like.

Next, the adjustment members 25, 26 and 125 are fabricated in the following manner. To the ceramic material powder, there are added and mixed the binder, and according to needs, the organic solvent, the dispersant, and the like. In such a way, the slurry was prepared. It is preferable that the ceramic material powder contains the ceramic powder serving as the main component, the sintering aids, and the binder. For example, aluminum nitride powder is used as the main component, and yttrium oxide powder and the like are added as the sintering aids. However, it is preferable that the total amount of the components other than the material of the main component be 5 wt % or less. It is preferable to mix the ceramic material powder by the ball mill and the like.

The obtained slurry is granulated by the spray granulation method and the like, and the granulated granules are thus obtained. The granulated granules thus obtained are molded by the molding method such as the metal die molding method, the cold isostatic pressing (CIP) method, and the slip cast method. The obtained molded body is fired under the conditions corresponding to the type of ceramics, which include the atmosphere, the firing temperature, the firing time, and the firing method, thus making it possible to fabricate the adjustment members 25, 26 and 125.

For example, in the case of using aluminum nitride powder as the ceramic material powder, the molded body can be fired by using the hot press method by being held for approximately 1 to 10 hours at the temperature of 1700 to 2200° C. in the atmosphere of the inert gas such as the nitrogen gas and the argon gas. It is preferable that a pressure applied to the molded body during the firing be 20 to 1000 kgf/cm$^2$. It is more preferable that the firing temperature be 1750 to 2050° C., and it is more preferable that the pressure be 50 to 200 kgf/cm$^2$.

It is preferable to form the insertion portion or groove portion 125a on the adjustment member 125 composed of the sintered body by the machining process. Moreover, it is more preferable that a tip end of the insertion portion 125a be processed into a tapered shape.

At the same time of the above-described fabrication of the base 10 and the adjustment members 25, 26 and 125, the tubular member 17 is fabricated. The tubular member 17 can be fabricated in a similar manner to that of the case of fabricating the base 10. Specifically, the granulated granules are prepared, a tubular molded body is fabricated, and the obtained molded body is subjected to the pressureless firing, for example, in nitrogen gas. It is preferable that the tubular member 17 be fabricated by using the same material powder as the ceramic material powder used for fabricating the base 10.

Next, the back surface 10b of the base 10 and the tubular member 17 are joined to each other, for example, by crimping, welding, brazing, soldering, and the like. The back surface 10b and the tubular member 17 can also be joined to each other by a solid-state welding method, a solid/liquid-state welding method, and the like. Specifically, a bonding agent adapted to the material of the back surface 10b and the tubular member 17 is coated on at least one of a joined surface of the back surface 10b and a joined surface of the tubular member 17. Then, the joined surfaces of the back surface 10b and the tubular member 17 are made to abut each other, and a heat treatment is performed therefor under atmosphere and temperature conditions corresponding to the material of the back surface 10b and the tubular member 17, thus making it possible to join the back surface 10b and the tubular member 17 to each other. In this case, a pressure may also be applied to the back surface 10b and the tubular member 17 in a direction perpendicular to the joined surfaces so as to thrust the back surface 10b and the tubular member 17 against each other.

For example, when the base 10a and the tubular member 17 are aluminum nitride sintered bodies, a rare earth compound or the like is coated on at least one thereof, and the base 10 and the tubular member 17, on at least one of which the rare earth compound or the like is coated, are held for 1 to 10 hours at 1500 to 2000° C. in the atmosphere of the inert gas such as the nitrogen gas and the argon gas. Thus, the base 10 and the tubular member 17 can be joined to each other. Moreover, it is also possible to integrally form the base 10 and the tubular member 17.

As described above, the manufacturing method of the heating device 100 includes the step of forming the base 10, the step of forming the plural gas flow passages 12 in the base 10, and the step of forming the adjustment members 25, 26 and 125 as the gas flow rate adjusting means. Thus, the heating device 100 which can adjust the injection amounts of the gas for each of the gas flow passages 12 can be obtained.

OTHER EMBODIMENTS

The present invention is not limited to the above-described embodiment, and various alterations and modifications are possible.

For example, while the description has been made of the adjustment members 25, 26 and 125 as examples of the gas flow rate adjusting means, the gas flow passages 12 can be partially obstructed by arranging spherical members therein.

Moreover, it is not necessary that the adjustment members 25 and the adjustment members 26 be formed into the same shape. For example, a mode may be adopted, in which the adjustment members 25 are the adjustment members 25 shown in FIG. 3, and the adjustment members 26 are the adjustment members 125 shown in FIG. 4.

Furthermore, embossments, grooves, and the like may be provided on the resistance heating body 11 as a peripheral member and on the substrate heating surface 10a. The shape of the power supply members 15 may be columnar, cable-like, plate-like, cord fabric-like, cylindrical, and so on, as well as rod-like. The power supply members 15 just need to be connected to the resistance heating body 11 by brazing, welding, eutectic bonding, crimping, fitting, screwing, and the like.

Moreover, the heating device 100 may be composed of the base 10 and the power supply members 15 without joining the tubular member 17 to the base 10.

A resistance heating body formed of a foil-like, linear, coil-like, or belt-like bulk body made of a high melting point material is formed on the first molded body, the second molded body is stacked on the first molded body, and an article thus obtained is subjected to the pressure molding and is fired, thus also making it possible to fabricate the base 10. Moreover, a resistance heating body formed of a thin film of a high melting point material may be formed on the molded body by a physical vapor deposition method or a chemical vapor deposition method.

Moreover, with regard to the fabrication method of the molded body, the granulated granules are stacked on the molded body and the resistance heating body 11, and an article thus obtained is subjected to press molding and is fired. In such a way, the base body 10 may also be fabricated.

Moreover, with regard to the connection of the power supply members 15 and end portions of the resistance heating body 11i a mode may be adopted, in which metal terminals which electrically connect to the end portions of the resistance heating body 11 are arranged in advance, and the power supply members 15 are connected to the metal terminals concerned.

With regard to the forming method of the insertion portions 25a, 26a and 125a of the adjustment members 25, 26 and 125 or the groove 143 of the insertion portion 125a, not the machining process but the pressure molding may be performed therefor, which follows housing of powder into the metal mold or the like. Thus, the fabrication process of the adjustment members 25, 26 and 125 can be simplified.

The material of the adjustment members 25, 26 and 125 is not limited to ceramics, and the adjustment members 25, 26 and 125 may also be formed of metal, a composite material of the metal and ceramics, or the like.

EXAMPLES

Next, a description will be made more in detail of the present invention based on an example. However, the present invention is not limited to the following example at all.

Example 1

First, the base 10 was fabricated in the following manner.

A binder and yttrium oxide as a sintering aid were added to aluminum nitride powder as the ceramic material powder, and were mixed by using a ball mill. In such a way, a slurry was prepared. The slurry was granulated by the spray granulation method and the like, and granulated granules were thus obtained. The granulated granules were molded into a disc shape by a metal die molding method. Moreover, a resistance heating body 11 made of molybdenum, which was formed into a coil shape in advance, was disposed on the disc-like molded body, and the above-described granulated granules were filled thereonto. Then, an article thus obtained was subjected to press molding, and the aluminum nitride molded body was thus fabricated. Then, the aluminum nitride molded body with which the resistance heating body 11 was formed integrally was set into a carbon-made sheath, and was fired by the hot press method. Specifically, the aluminum nitride molded body was held for 2 hours at 1800° C. in a nitrogen atmosphere while applying a pressure of 200 kgs/cm$^2$ to the nitrogen. Thus, the aluminum nitride sintered body was fired.

In the aluminum nitride sintered body thus obtained, the substrate heating surface 10a was subjected to a planarization process, and the aluminum nitride sintered body was subjected to drilling for the power supply members 15. Thus, the base 10 was fabricated. With regard to the size of the base 10, the diameter thereof was set at 237 mm, and the thickness thereof was set at 18 mm. Moreover, with regard to the size of the cylindrical tubular member 17, the outer diameter thereof was set at 55 mm, the inner diameter thereof was set at 45 mm, and the length thereof was set at 169 mm.

Next, two gas introduction ports 12g with a diameter of 3 mm were provided on the center portion of the base 10 from the back surface 10b of the base 10 by a machining process. The first gas passages 12a, of which number was four per each of the gas introduction ports 12g and 12g, were formed radially from the respective gas introduction ports 12g and 12 toward the outside in the circumferential direction. The first gas passages 12a were formed below the embedded resistance heating body 11.

Moreover, second gas passages 12b with a diameter of 3 mm were formed from the substrate heating surface 10a in the direction (vertical direction) perpendicular to the substrate heating surface 10a. The upper ends of the second gas passages 12b were formed into the gas injection ports 12h. As shown in FIG. 1, the gas injection ports 12h were formed at positions on the outer circumferential ends of the substrate heating surface 10a, which were obtained by dividing the outer circumference into 8 equal portions. Specifically, the gas injection ports 12h were formed at positions of 12 o'clock, half past one o'clock, three o'clock, half past four o'clock, six o'clock, half past seven o'clock, nine o'clock, and half past ten o'clock with respect to a dial of a clock.

Next, the insertion holes 23 and 24 which communicate with the gas flow passages 12 from the back surface 10b and side surface 10c of the base 10 were formed. Female screw portions (groove portions 143) of M3 screws were formed on inner circumferential surfaces of the insertion holes 23 and 24 by the machining process.

Next, the power supply members 15 including nickel-made terminals were brazed to the base 10 on which the resistance heating body 11 were partially exposed.

Moreover, in a similar way to the base 10, the adjustment members 25 and 26 made of aluminum nitride were fabricated. Specifically, after the aluminum nitride molded bodies were fired, the groove portions 143 threaded as the M3 screws were formed thereon by the machining process, and the adjustment members 25 and 26 were thus obtained. The adjustment members 25 and 26 thus formed were inserted into and screwed with the insertion holes 23 and 24. Thus, the heating device 100 including the base 10 having the gas flow passages 12, and the adjustment members 25 and 26 was obtained.

(Evaluation Method)

The following evaluation was performed for the obtained heating device 100.

Nitrogen gas was injected into the gas flow passages 12 of the heating device 100, and the heating device 100 was heated up to 420° C. Then, the temperature distribution of the substrate heating surface 10a was measured by a radiation thermometer. On the substrate heating surface 10a, temperatures on areas in directions of 12 o'clock and half past one o'clock, which are shown in FIG. 1, were higher than temperatures of the other areas, and a difference between the maximum temperature and the minimum temperature on the substrate heating surface 10a was 13° C.

Subsequently, the heating device 100 was once cooled down, and the gas flow rates of the adjustment members 25 arranged in the gas flow passages 12 located at the positions in the directions of 12 o'clock and half past one o'clock were reduced by the adjustment thereof, and the cooling of the substrate heating surface 10a, which is accompanied with the inflow of the gas, was restricted. Moreover, the gas was injected into the gas flow passages 12, and the injection amounts of the gas from the respective injection ports 12h were measured by an anemometer. Then, the adjustment members 26 provided on the side surface 10c of the base 10 were adjusted so that the injection amounts of the gas from the respective gas injection ports 12h could be uniform with one another.

Comparative Example 1

Comparative example 1 is different from Example 1 in that the gas flow rates were not adjusted by the adjustment members 25 and 26. However, Comparative example 1 is entirely the same as Example 1 except the above-described point.

The silicon substrates were mounted on the heating devices 100 of Example 1 and Comparative example 1, which are described above. High-purity tungsten hexafluoride gas was introduced from above the upper surface of the substrate, and a tungsten film was formed on the substrate by a CVD apparatus. Moreover, nitrogen gas was injected as barrier gas into the gas flow passages 12.

(Evaluation Result)

In Example 1, the tungsten film was not formed on the outer circumferential portion of the silicon substrate. Moreover, the tungsten film was not formed on the interface between the substrate heating surface 10a and the silicon substrate around the outer circumferences thereof, either.

In Comparative example 1, the tungsten film was formed also on the outer circumferential portion of the silicon substrate. Moreover, the tungsten film was formed also on the interface between the substrate heating surface 10a and the silicon substrate.

In order to examine a difference between Example 1 and Comparative example 1, each heating device 100 was heated up to 420° C. while injecting the nitrogen gas into the gas flow passages 12 without mounting the silicon substrate on the substrate heating surface 10a again, and the temperature distribution of the substrate heating surface 10a was measured by the radiation thermometer. The difference between the maximum temperature and the minimum temperature on the substrate heating surface 10a became 6° C., and it was found that the uniformity of the temperature distribution in the substrate heating surface 10a could be improved as compared with the case before the adjustment.

Thus, in Example 1, the silicon substrate was able to be separated from the substrate heating surface 10a with ease. Note that, in Comparative example 1, when the silicon substrate was attempted to be separated from the substrate heating surface 10a, the tungsten film on the interface between the substrate heating surface 10a and the silicon substrate was peeled off therefrom, and while taking such peeling off as an origin, a crack occurred on the tungsten film on the silicon substrate.

What is claimed is:

1. A heating device, comprising:
a ceramic base having gas flow passages formed therein;
a resistance heating body embedded in the base; and
gas flow rate adjusting members, which vary flow rates of gas flowing through inner portions of the gas flow passages, comprising adjustment members that each include an insertion portion capable of being inserted into an insertion hole of the base, whereby the insertion portions protrude/retreat into/out of the inner portions of the gas flow passages;

wherein a front surface of the base defines a substrate heating surface which heats up a substrate, and gas injection ports open on the substrate heating surface;

wherein one end of each of the gas flow passages defines one of the gas injection ports, and the other end of each of the gas flow passages defines a gas introduction port through which the gas flows into the gas flow passage; and wherein the gas introduced from the gas introduction ports flows through the inner portions of the gas flow passages, and is discharged from the gas injection ports to the substrate heating surface.

2. The heating device according to claim 1, wherein each of the gas flow passages includes a first gas passage extending along the substrate heating surface; and wherein each insertion portion of the adjustment members protrudes/retreats into/out of an inner portion of the first gas passage through the insertion hole provided on a back surface of the base.

3. The heating device according to claim 1, wherein the gas injection ports are disposed on an outer circumferential end portion of the substrate heating surface;

wherein each of the gas flow passages includes a second gas passage, and the second gas passage extends perpendicularly to the substrate heating surface, and an end portion of the second gas passage defines the gas injection port; and wherein each insertion portion of the adjustment members protrudes/retreats into/out of the second gas passage through a side surface of the base.

4. The heating device according to claim 1, wherein the insertion holes of the base and the insertion portions of the adjustment member are formed so than an inner diameter dimension of the insertion holes and an outer diameter dimension of the insertion portions are substantially the same, and the insertion portions of the adjustment member are thereby inserted into the insertion holes in a state of being brought into intimate contact therewith.

5. The heating device according to claim 1, wherein spiral grooves are formed on an outer circumferential surface of each of the insertion portions of the adjustment members and on an inner circumferential surface of each of the insertion holes of the base and are screwed with each other, so that when the adjustment members are rotated, the insertion portions thereby protrude/retreat into/out of the gas flow passages.

6. The heating device according to claim 1, wherein the insertion portions of the adjustment members contain ceramics.

* * * * *